(12) United States Patent
De Spiegeleer et al.

(10) Patent No.: US 8,738,855 B2
(45) Date of Patent: May 27, 2014

(54) METHOD OF STORING A DATA SET IN A DISTRIBUTED STORAGE SYSTEM, DISTRIBUTED STORAGE SYSTEM AND COMPUTER PROGRAM PRODUCT FOR USE WITH SAID METHOD

(75) Inventors: Kristof De Spiegeleer, Knokke-Heist (BE); Romain Raymond Agnes Slootmaekers, Hervelee (BE)

(73) Assignee: Amplidata NV, Lochristi (BE)

( * ) Notice: Subject to any disclaimer, the term of this patent is extended or adjusted under 35 U.S.C. 154(b) by 474 days.

(21) Appl. No.: 12/991,131

(22) PCT Filed: May 4, 2009

(86) PCT No.: PCT/EP2009/003181
§ 371 (c)(1),
(2), (4) Date: Dec. 21, 2010

(87) PCT Pub. No.: WO2009/135630
PCT Pub. Date: Nov. 12, 2009

(65) Prior Publication Data
US 2011/0113282 A1    May 12, 2011

Related U.S. Application Data

(60) Provisional application No. 61/050,269, filed on May 5, 2008.

(51) Int. Cl.
*G06F 12/08* (2006.01)
(52) U.S. Cl.
USPC ............................ 711/114; 711/154; 711/161
(58) Field of Classification Search
USPC .......................................... 711/114, 154, 162
See application file for complete search history.

(56) References Cited

U.S. PATENT DOCUMENTS

2002/0190878 A1   12/2002 Luby
2007/0136525 A1*   6/2007 Read .............................. 711/114

FOREIGN PATENT DOCUMENTS

WO            01/10043           2/2001

OTHER PUBLICATIONS

Maymounkov, Petar. "Online Codes" Nov. 2002, Secure Computer Systems Group, New York University.*
Wolfram Mathworld "Natural Number" retrieved from the Internet May 6, 2013 http://mathworld.wolfram.com/NaturalNumber.html.*
Petar Maymounkov et al., "Rateless Codes and Big Downloads", XP-002314197, NYU Department of Computer Science, pp. 1-6.
International Search Report for International Application No. PCT/EP2009/003181, dated May 4, 2009.
Written Opinion of the International Searching Authority for International Patent Application No. PCT/EP2009/003181 mailed May 4, 2009.

* cited by examiner

*Primary Examiner* — Kenneth Lo
(74) *Attorney, Agent, or Firm* — Workman Nydegger

(57) ABSTRACT

The present invention is directed to a method of storing a data set in a storage system. Said storage system comprises a plurality of storage entities. The method comprises the following steps. A step of forming at least one data set block from said data set using a fragmentation entity. A step of encoding said at least one data set block by means of an encoding entity, wherein said encoding entity provides a plurality of encoded blocks based on said at least one data set block at an output of said encoding entity. And a step of distributing said encoded blocks amongst at least two of said storage entities using a distribution entity for storage thereof by said storage entities. Said encoding entity uses a rateless erasure encoding algorithm based on rateless codes for encoding said at least one data set block. The invention is further directed to a storage system and a computer program product.

21 Claims, 3 Drawing Sheets

METHOD OF STORING A DATA SET IN A DISTRIBUTED STORAGE SYSTEM, DISTRIBUTED STORAGE SYSTEM AND COMPUTER PROGRAM PRODUCT FOR USE WITH SAID METHOD

CROSS-REFERENCE TO RELATED APPLICATIONS

The present applications claims the benefit of priority to International Patent Application No. PCT/EP2009/000083 filed 04 May 2009, which further claims the benefit of priority to U.S. Provisional Patent Application No. 61/050,269 filed 05 May 2008, the contents of which are incorporated herein by reference in their entirety.

DESCRIPTION

1. Field of the Invention

The present invention is directed to a method of storing a data set in a distributed storage system, wherein said distributed storage system comprises a plurality of storage entities. The present invention is further directed to a distributed storage system, and a computer program product for use therewith.

2. Background of the Invention

As the complexity and amount of electronic applications and services all over the world continues to grow, and the corresponding amount of data in this information-based society grows explosively therewith, data storage becomes a growing need in the information and communication industry. Many types of storage solutions are available in industry. Important requirements underlying storage of data are that the storage solution has to be reliable and also flexible in order to account for future increases in the required storage capacity.

Over the past decades, the concept of a redundant array of inexpensive disks (RAID) has been developed in storage industry for storing large amounts of data redundantly, such as to provide a certain level of protection against failure of disks or degradation of the data on the disks. RAID provides a redundant storage solution, but it suffers from inefficiency in respect of the use of storage capacity for achieving redundancy.

A popular class of storage solutions are the so called distributed storage systems. In a distributed storage system, data to be stored is distributed amongst a plurality of (remote or local) storage entities. In order to reduce the required capacity, the data may become compressed or encoded; the redundancy can be achieved by storing the same data multiple times on different entities, such that one of the storage entities fails, the data can still be retrieved from the redundant copies.

It is an ongoing objective within the storage industry to store the data as efficient as possible, making best use of the available capacity, in a manner which is as redundant as possible such that failing of storage entities or general degradation of the quality of the stored data can be resolved within the storage system. As already mentioned above, preferably the storage solutions should be scalable, i.e. sufficiently flexible for increasing their capacity in order to satisfy the growing needs for data capacity.

SUMMARY OF THE INVENTION

The above-mentioned objectives are achieved by the present invention in that there is provided a method of storing a data set in a storage system, wherein said storage system comprises a plurality of storage entities, wherein said method comprises the steps of: forming at least one data set block from said data set using a fragmentation entity; encoding said at least one data set block by means of an encoding entity, wherein said encoding entity provides a plurality of encoded blocks based on said at least one data set block at an output of said encoding entity; distributing said encoded blocks amongst at least two of said storage entities using a distribution entity for storage thereof by said storage entities; wherein said encoding entity uses a rateless erasure encoding algorithm based on rateless codes for encoding said at least one data set block.

In storage systems, use can be made of error detection and correction algorithms for providing the required redundancy of the data stored. Error detection and correction algorithms can be used to locate and correct data deficiencies of the data, for example once the data is retrieved from storage. Error correction algorithms encode the data such that the original data can be retrieved from a sufficient amount of encoded data.

In order to achieve the objects underlying the invention, the invention uses rateless coding. Rateless codes were originally developed for use in communications systems across lossy channels. A lossy channel is a channel where during transport, data may not arrive, may be modified, or arrive out of order. Rateless coding has the property that an unlimited amount of encoded data can be created from any set of source data. The nature of rateless coding algorithms is such that it allows for a very efficient manner of redundantly storing the data set.

In practice, the smallest possible subset that is still sufficiently large for recovering the original data may only be slightly larger than the size of the original data. This is one of the advantages of applying rateless erasure codes in storage solutions: it is an efficient manner of redundantly storing data. Moreover, the level of redundancy is controllable. More redundancy can be achieved by simply generating more encoded blocks. Therefore, the amount of redundancy in the storage facility is easily scalable. Last but not least, all that matters in the end is that sufficient encoded blocks can be retrieved from the storage entities for enabling recovery of the original data. It is irrelevant where a particular encoded block is stored. These are major advantages over conventional storage systems.

In accordance with an embodiment of the present invention, the rateless erasure encoding algorithm uses online codes for encoding said at least one data set block. Rateless erasure codes were originally developed for communication during deep space NASA missions, for example missions to other planets in the solar system. The communication channel has a high latency and is unreliable, while at the same time a deep space probe must at all times be able to retrieve the original message.

In the present invention, online codes are applied to a storage system, where the storage entities itself are to be regarded as the 'lossy channel' in a sense that it cannot be guaranteed that all the encoded blocks stored in the storage entity will be retrieved once the data set is needed again. It is noted that part of the data may be corrupted and part of the storage entities may for example fail such that some of the encoded blocks are lost during storage. Online codes make it possible to always retrieve the original data if sufficient encoded blocks are retrievable for solving the system of equations. Online codes have the further advantage over other currently known rateless coding systems that the coding and decoding processes are linear processes. Therefore, the encoding and decoding process can be performed in less time and is less complicated in comparison to other known rateless erasure coding techniques.

According to an embodiment of the invention, the encoded blocks are sampled by the encoding entity by randomly selecting a number of data set blocks and calculating the encoded blocks as the exclusive-or (XOR( )) of said selected data set blocks. The selection of data set blocks is such that all data set blocks are processed. Given that for a number of $n_{crit}$ encoded blocks it can be mathematically proven that the original data set is decodable with a sufficiently large probability of success, the minimum amount of encoded blocks to be stored on each of the storage entities involved in the storage, according to an embodiment, can be calculated as $$n_g = \frac{n_{crit}}{(g-s)} \text{ and } n_g, n_{crit}, g, s \in \mathbb{N} \wedge g > 0$$

wherein g is the amount of storage entities involved in a storage and s is the maximum amount of storage entities that is allowed or expected to concurrently fail at the same time (for example 2); $n_g$ is the number of encoded blocks required to be sent to each of the storage facilities.

The above can be corrected for expected data degrading. If it is assumed that after a certain period a fraction r of the original encoded blocks can still be retrieved from a storage system or entity, the above mentioned relation between the number encoded blocks to be stored on each storage entity becomes:

$$n_g = \frac{n_{crit}}{r \cdot (g-s)}$$

In a further embodiment, a director entity is responsible for selecting storage entities for use in the storage system. The director entity may select the number of storage entities, but may also have policies on the nature or location of these storage entities to be selected.

According to a further embodiment, the distribution entity uses a distribution policy for providing said encoded blocks to said at least two storage entities. This policy may be selected from a group comprising a round robin policy, a random selection policy, or a policy wherein each storage entity is provided with a plurality of encoded blocks sequentially.

The method of the invention as described so far enables efficient and redundant storage wherein the amount of redundancy can be easily adjusted to the needs of the particular case. However, if a storage entity actually fails, some maintenance of the stored data may be required in order to continue meeting the requirements of redundancy, for example in case all data stored on a particular one of the storage entities is lost. In such cases, the original data may simply be recovered from the remaining encoded blocks, and the method of the invention is reapplied for storing the number of missing blocks. Alternatively, after recovering the original data, the recovered data may be used to generate additional encoded blocks for storage on said storage entities.

In accordance with a further embodiment of the invention, said method further comprises the steps of: after storage of said encoded blocks on said at least two of said storage entities, retrieving one or more encoded blocks from at least one of said storage entities; and redistributing said retrieved encoded blocks amongst at least two further storage entities of said storage entities. The process of re-balancing or rearranging the encoded blocks is a useful maintenance tool. It may be applied when storage entities require replacement, when data is to be migrated to fewer or more storage entities, or when an imbalance was created due to a storage entity that became unavailable during the application of the method of the invention.

According to a further aspect of the invention, there is provided a storage system for storing a data set, said storage system comprising a plurality of storage entities, a fragmentation entity for forming at least one data set block from said data set, an encoding entity for encoding said at least one data set block, wherein said encoding entity is arranged for assembling a plurality of encoded blocks based on said at least one data set block at an output of said encoding entity, and a distribution entity for distributing said encoded blocks amongst at least two of said storage entities for storage thereof by said storage entities, wherein said encoding entity is arranged for using a rateless erasure encoding algorithm based on rateless codes for encoding said at least one data set block.

According to another aspect, there is provided a computer readable medium comprising a computer program product comprising computer readable instructions for causing a computer to perform a method in accordance with the first aspect, when the computer program product is executed on the computer.

BRIEF DESCRIPTION OF THE DRAWINGS

Herein below, the invention will be described by means of some non-exclusive examples and embodiments, with reference to the enclosed drawings. The drawings are for illustrative and explanatory purposes only, and do not have any limiting effect on the teachings and scope of the invention. The scope of the invention is only limited by the claims attached. In the drawings:

DETAILED DESCRIPTION

Figure 1:
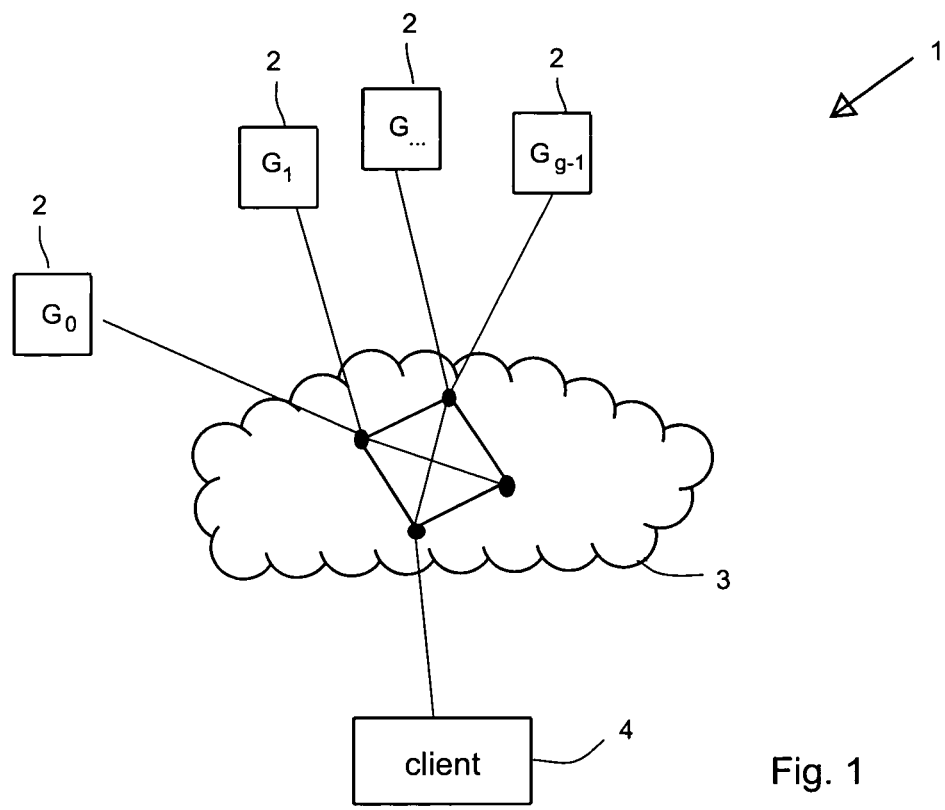
FIG. 1 illustrates a storage system for use with the present invention.

Online storage systems are widely used. Typical examples of such systems are systems where content can be stored using a simple web service, and which are available from anywhere on the internet. Most distributed storage systems accept either the possibility of non availability or either resort to replication to guarantee availability. The notable exception is a prior art digital data storage system which disperses content over available nodes using an error correcting scheme based on Reed Solomon codes.

The present invention applies not only to online or distributed storage by systems, but to any storage systems wherein storage is performed in multiple storage groups.

These storage groups may resolve on a single storage medium (e.g. sections of a single disk), or these groups may represent different storage media, either local or remote (e.g. via a network or within a single apparatus). The method and system for distributed storage according to the invention takes advantage of rateless erasure codes for both transport and storage. According to a specific embodiment of the invention, use is made of online codes for storage of the data.

Online codes were devised as a forward error correcting scheme for communication over lossy channels. They are comparable to other rateless codes, like LT codes and Turbo Codes, but have linear encoding and decoding time. It is noted that the method of the present invention may be performed using other rateless erasure codes.

Online Codes

Online codes are an encoding scheme specifically devised for communication over lossy channels. Here, the lossy channel is one that can drop packets, and can change the order in which they arrive, but if packages arrive, they arrive unaltered: the contents is guaranteed unchanged.

Online codes are specified by 2 parameters: $\epsilon$ (a measure of the suboptimality) and q (which affects decoding success probability).

A message of n blocks can be decoded with a probability $p=1-(\epsilon/2)^{q+1}$ from $n_{crit}=(0.55q\epsilon+1)(1+\epsilon)n$ encoded blocks. A typical working set of parameters is $\epsilon=0.01$, q=3 resulting in $n_{crit}<1.03n$ and a successful decodability probability $p=1-(1/200)^4$, which is perfectly acceptable for normal usage.

Encoding

Encoding works as follows: a message M is split into n fixed size message blocks $M_i$:

$$M=[M_0, \ldots, M_{n-}]$$

One generates a small amount of auxilary blocks, using a pseudo random number generator. For each message block, one picks q auxilary blocks, and each auxilary block is computed as the XOR of all the message blocks attached to it. Define $$L=[M_0, \ldots, M_{n-1}, A_n, \ldots, A_{n'}]$$

Next, one generates check blocks by first generating an id for each check block. The id needs to be unique within this message and is drawn from a large ID space. The check block data is computed by XOR-ing blocks taken from L. The procedure is as follows: One seeds a random number generator with the id and uses it to pick a degree d and calculates the XOR of d blocks taken from L. The exact details are known to the skilled person being familiar with online codes. As a result only the check block data and the check block id need to be transmitted over the channel.

Decoding

A check block actually represents an equation. The data is the right hand side, and its id fully specifies which L blocks were used in the construction of that particular right hand side. Reconstructing the original message boils down to solving a very simple (sparse) system of block equations.

The skilled person will appreciate that the original data can be recovered from any subset of check blocks having a size sufficient such as to provide enough equations for solving the system.

Method for Distributed Storage Using Online Codes

The problem we're trying to solve is the following: how to divide data from a data set in the form of a content file over g storage groups $G_{j-0 \ldots g-1}$, such in a way the content can be reconstructed, even if some of the groups are unavailable.

Using online codes to split and encode the content file, one just has to generate "enough" check blocks (i.e. encoded blocks), and scatter these over the storage groups $G_j$. The fact that it does not really matter where each individual check block is stored (it only matters how many blocks reside on each storage group) makes it very easy to derive conditions on the distribution of the check blocks over the storage nodes, in function of the pre-envisioned failure modes. The ease with which one can express the conditions for check block distributions is best shown in an example.

Suppose, for example, one always wants to be able to restore a file f of n message blocks, even in the worst case scenario of 2 failing (down, unreachable, . . . ) groups. One just has to distribute the check blocks evenly over all the groups with $n_G$ the number of check blocks on each group. The condition for reconstructability is $$n_G \cdot (g-2) > n_{crit}$$

or $$n_G > \frac{n_{crit}}{(g-2)}$$

So in this case, enough means: more than $n_G$ check blocks per group. To fully appreciate the concept, let's assume that on top of failing groups, one wants to take into account the possibility of failing check blocks (bit rot, bad sectors, . . . ). Suppose we accept that only r=99.5% of the check blocks on a group are ok. The condition then becomes $$r \cdot n_G > \frac{n_{crit}}{(g-2)}$$

or $$n_G > \frac{n_{crit}}{(g-2)r}$$

As shown here, most foreseen failure modes are easily incorporated into the calculation for the number of check blocks per file needed on each storage group.

System for Distributed Storage Using Online Codes

As shown in FIG. 1, the storage system 1 may be a set of g storage groups 2, connected through a network 3, typically the internet. A storage group 2 is a logical unit connected to the network providing processing and permanent storage resources. Clients 4 can connect to the groups in the system and upload or download packages containing check blocks.

Figure 2:
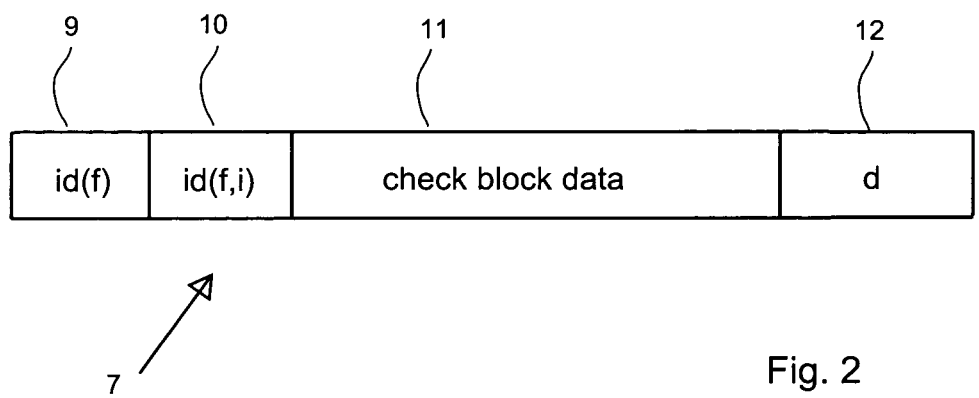
FIG. 2 illustrates the data format of an encoded block (check block) in accordance with the invention.

The contents of a package or check block 7 sent to a storage group 2 is shown in FIG. 2. For reasons of brevity and clarity, all authentication and authorization aspects of the communication have been abstracted away. Each file is uniquely identified with file identifier id(f) 9 and each check block for that file is identified using check block identifier 10 id(f,i). A check block identifier 10 is unique within the context of file f. Each check block 7 contains the check block data 11, a digest 12 as explained below, and a preamble containing the file identifier 9 and the check block identifier 10.

In its simplest form, what is needed to upload a content file f to the storage system is this: for the file f, the client generates the check blocks Cid(f,i) needed, while dividing these over the storage groups following a scatter pattern or policy. Each storage group just stores for each check block Cid(f,i) the data, the check block identifier id(f,i) 10, and a digest 12 d=digest(data,id(f,i)). This digest 12 is important to be able to verify later that the stored content is still correct. Each storage group may be able to provide the following functions:

a. number_of_checkblocks($id_f$) returns, for the file with $id_f$=id(f), the number of check blocks to be found on this storage group.

b. provide_blocks($id_f$) sets up a stream from which the checkblocks can be read.

c. store_blocks(sob) reads blocks from the stream of blocks sob and stores these on the storage group.

d. get/set(policy, id$_f$) fetch or store the policy associated with a file f.

The functions listed above are not exclusive, and the skilled person will appreciate that other functions may be implemented for use in the storage system.

A preferred embodiment of the system is a simple embodiment, where all connections between clients and storage groups are TCP/IP sockets, and all control is exercised by the clients. The storage groups reside on different geographical locations and provide comparable processing and storage resources. An alternative is to replace the TCP/IP sockets based connections with a UDP data transport and a TCP/IP control channel. Note, however, that it is not essential that the various storage groups or storage entities are interconnected through a telecommunications network. A storage system may also comprise various storage groups that are directly connected to a single local system, or even storage groups available on a single physical storage means.

Figure 3:
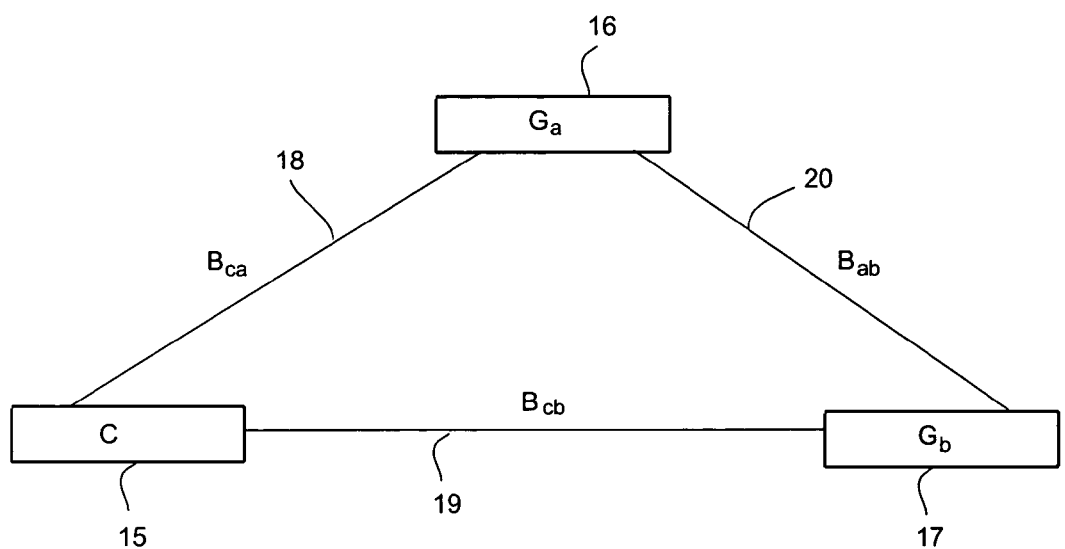
FIG. 3 illustrates an example of rerouting check blocks to a storage group, in accordance with the invention.

According to a further embodiment, if (as in FIG. 3), for some reason, bandwidth is quite different between a client C 15 and storage groups $G_a$ 16 and $G_b$ 17, and bandwidths $B_ca$ 18 and $B_ab$ 20 are sufficiently large compared to $B_cb$ 20, then one can use the route $CG_aG_b$ as a turnpike to facilitate uploads from C to $G_b$. This has a setup cost, but is feasible due to the block fungibility.

Figure 4:
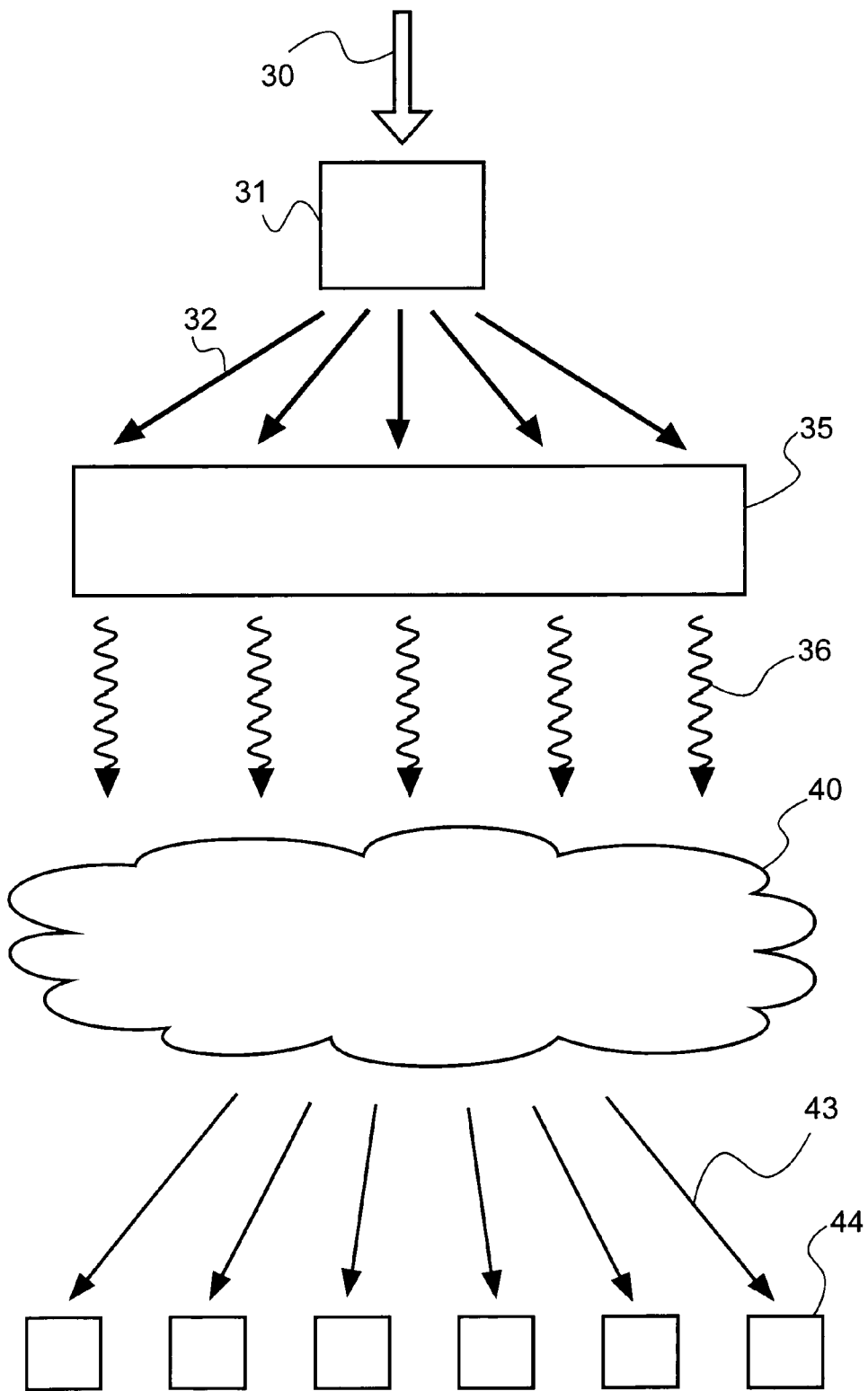
FIG. 4 illustrates a method in accordance with the present invention.

FIG. 4 schematically illustrates a method of the present invention. A data set 30 of a certain size is fragmented in step 31 by a fragmentation entity. This yields a plurality of data set blocks 32. In step 35, each data set block 32 is used for providing a plurality of encoded blocks or check blocks, using a rateless erasure coding scheme (as described above), such as online coding. This provides a stream 36 of check blocks for each data set block 32. The check blocks are distributed (step 43) amongst a plurality of storage groups 44. The storage groups, in the given example, are interconnected through a telecommunications network 40.

Distributing the check blocks amongst the storage groups may be subject to a distribution policy. This policy may include a round robin policy, a random selection policy, or a policy wherein each storage entity is provided with a plurality of encoded blocks subsequently. Moreover, although not illustrated in FIG. 4, the storage groups used for storing the data may be selected in advance by a director unit, e.g. based on a selection policy.

The method and system of the present invention provides several advantages over conventional storage solutions available.

The system and method of the present invention provides improved storage efficiency. Compared to prior art distributed storage methods and systems using replication based schemes in the solution of the present invention, less storage costs are incurred. For example, a replication based system with 8 groups that guarantees content availability in the case where 2 groups are down, needs to have replicas on at least 3 groups. Replication count is at least 3 and thus we need to store at least 3n blocks. In the embodiment described in relation to FIGS. 1 and 2, given the above conditions, we need to store only $(g/(g-2))n_{crit}=(8/6)n_{crit}<(1.4)(1.03)n=1.44n$ blocks.

Moreover, the invention allows for more fine grained policies to be applied. In the present invention policies can be defined for each file individually, instead of the system wide policy that is usually imposed in a distributed storage system.

In addition to the above, the present invention allows for reduced CPU and bandwidth usage. The present invention does not need to reconstruct the content, it merely needs to assert reconstructability. This can be done from inspecting all ids of a content file. So, if a process on a group wants to assert that a file, for which it has $n_G$ blocks is reconstructable, it has to ask the g-1 other groups in the system to send it the number of check block available on that group, generated from that file, and verify it against $n_{crit}$.

The invention also makes faster downloads from the storage system possible, for example faster downloading of a file from the storage groups 2. When a client 4 wants to reconstruct a content file on its tier, he initiates a download from all groups 2 and stops when he has enough checkblocks to reconstruct the content. In a conventional distributed download scheme, one has to wait for the last block from slowest connection to be able to reconstruct the contents. Here however, since the check blocks are fungible one can stop downloading whenever enough blocks are downloaded. The blocks arriving over the slow connection are not really needed as they can equally be replaced with blocks arriving over faster connections, but they can be put to good use when they arrive, as they are also useful. This results in faster downloads.

The present invention uses rateless erasure coding to store data in a redundant manner. In particular, and in accordance with an embodiment, the invention applies online coding as a rateless erasure coding scheme for achieving the benefits of the invention. In the context of online codes, encoding can be seen as applying a transformation matrix A to the input, and thus, every encoded block is the right hand side of a linear equation, and is in fact the scalar product of a row of A and the input vector. Again, in the case of online codes, the matrix A is sparse, its elements are all 0 or 1 and the addition operator is XOR. Both input vector and the right hand side consists of data blocks. Online codes apply extra conditions on the shape of the matrix A to ensure that any subset of sufficient equations yields an easily solvable system.

By applying an online coding algorithm, each encoded block represents an equation in a system of equations. The original data can be recovered by resolving the system of equations. For recovering the original data, all that is required is an arbitrary subset of encoded blocks, provided that said subset comprises sufficient encoded blocks such as to yield a solvable system of linearly independent equations. This technique not only allows for efficient storage of data in a redundant manner, but in addition, solving the system is a linear process that can be performed relatively easy.

The present invention may be practiced differently than specifically described herein. The scope of the invention is only limited by the appended claims.

The invention claimed is:

1. A method of storing a data set in a storage system, wherein the storage system comprises a plurality of storage groups representing different storage media, wherein the method comprises:

forming at least one data set block from the data set using a fragmentation entity;

encoding the at least one data set block by means of an encoding entity, wherein the encoding entity provides a plurality of encoded blocks based on the at least one data set block at an output of the encoding entity, and wherein the encoding entity uses a rateless erasure encoding algorithm based on rateless codes for encoding the at least one data set block; and distributing the encoded blocks amongst at least two of the storage groups using a distribution entity for storage thereof by the storage groups, wherein the encoded blocks are distributed amongst a number of g storage groups, and wherein $n_{crit}$ is the number of encoding blocks required for decoding the data set with a sufficiently large probability of success, wherein each of the g storage groups receives at least $n_g$ encoded blocks, with $$n_g = \frac{n_{crit}}{(g-s)} \text{ and } n_g, n_{crit}, g, s \in \mathbb{N} \wedge g > 0$$

wherein s is the maximum number of storage groups that are allowed or expected to concurrently fail, g>s, and s≥2.

2. The method of claim 1, wherein the rateless erasure encoding algorithm uses online codes for encoding the at least one data set block.

3. The method of claim 1, wherein each of the encoded blocks is assembled by the encoding entity by selecting a number of data set blocks of the at least one data set block, and calculating the encoded block as the exclusive or of the selected data set blocks.

4. The method of claim 3, wherein the number of data set blocks used for assembling each of the encoded blocks is varied for each encoded block by the encoding entity.

5. A method of storing a data set in a storage system, wherein the storage system comprises a plurality of storage groups representing different storage media, wherein the method comprises:
forming at least one data set block from the data set using a fragmentation entity;
encoding the at least one data set block by means of an encoding entity, wherein the encoding entity provides a plurality of encoded blocks based on the at least one data set block at an output of the encoding entity, and wherein the encoding entity uses a rateless erasure encoding algorithm based on rateless codes for encoding the at least one data set block; and
distributing the encoded blocks amongst at least two of the storage groups using a distribution entity for storage thereof by the storage groups,
wherein the encoded blocks are distributed amongst a number of g storage groups, and wherein $n_{crit}$ is the number of encoding blocks required for decoding the data set with a sufficiently large probability of success, wherein each of the g storage groups receives at least $n_g$ encoded blocks, with $$n_g = \frac{n_{crit}}{(g-s)} \text{ and } n_g, n_{crit}, g, s \in \mathbb{N} \wedge g > 0$$

wherein s is the maximum number of storage groups that are allowed or expected to concurrently fail, g>s, and s≥2,
wherein each of the g storage groups receives at least $n_g$ encoded blocks, with $$n_g = \frac{n_{crit}}{(g-s)} \text{ and } n_g, n_{crit}, g, s \in \mathbb{N} \wedge g > 0$$

and r is the minimum fraction of non-defective encoded blocks in each storage group.

6. The method of claim 1, wherein the distribution entity uses a distribution policy for providing the encoded blocks to the at least two storage groups.

7. The method of claim 1, wherein the method further comprises:
after storage of the encoded blocks on the at least two of the storage groups, retrieving one or more encoded blocks from at least one of the storage groups; and
redistributing the retrieved encoded blocks amongst at least two further storage groups of the storage groups.

8. The method of claim 1, wherein the at least two storage groups for receiving the encoded blocks are selected by a director entity, the director entity communicating the selected storage groups to the distribution entity.

9. A storage system for storing a data set, the storage system comprising:
a plurality of storage groups representing different storage media,
a fragmentation entity for forming at least one data set block from the data set,
an encoding entity for encoding the at least one data set block, wherein the encoding entity is arranged for assembling a plurality of encoded blocks based on the at least one data set block at an output of the encoding entity, wherein the encoding entity is arranged for using a rateless erasure encoding algorithm based on rateless codes for encoding the at least one data set block, and
a distribution entity for distributing the encoded blocks amongst at least two of the storage groups for storage thereof by the storage groups, wherein the encoded blocks are distributed amongst a number of g storage groups, and wherein $n_{crit}$ is the number of encoding blocks required for decoding the data set with a sufficiently large probability of success, wherein each of the g storage groups receives at least $n_g$ encoded blocks, with $$n_g = \frac{n_{crit}}{(g-s)} \text{ and } n_g, n_{crit}, g, s \in \mathbb{N} \wedge g > 0$$

wherein s is the maximum number of storage groups that are allowed or expected to concurrently fail, g>s, and s≥2.

10. The storage system of claim 9, wherein the encoding entity is arranged for using a rateless erasure encoding algorithm based on online codes for encoding the at least one data set block.

11. The storage system of claim 9, wherein the distribution entity is arranged for applying a distribution policy for distributing the encoded blocks.

12. The storage system of claim 9, further comprising a director entity for selecting the at least two storage groups of the storage system for receiving the encoded blocks.

13. A non-transitory computer readable medium comprising a computer program product comprising computer readable instructions for causing a computer to perform a method of claim 1, when the computer program product is executed on the computer.

14. A method of storing a data set in a storage system, wherein the storage system comprises a plurality of storage groups representing different storage media, wherein the method comprises:
forming at least one data set block from the data set using a fragmentation entity;
encoding the at least one data set block by means of an encoding entity, wherein the encoding entity provides a plurality of encoded blocks based on the at least one data set block at an output of the encoding entity and uses a rateless erasure encoding algorithm based on rateless codes for encoding the at least one data set block;

distributing the encoded blocks amongst at least two of the plurality of storage groups using a distribution entity for storage thereof by the storage groups, wherein the encoded blocks are distributed amongst a number of g storage groups, and wherein $n_{crit}$ is the number of encoding blocks required for decoding the data set with a sufficiently large probability of success, wherein each of the g storage groups receives at least $n_g$ encoded blocks, with $$n_g = \frac{n_{crit}}{(g-s)} \text{ and } n_g, n_{crit}, g, s \in \mathbb{N} \wedge g > 0$$

wherein s is the maximum number of storage groups that are allowed or expected to concurrently fail, g>s, and s≥2;
   after storage of the encoded blocks on the at least two storage groups, retrieving one or more encoded blocks from at least one of the at least two storage groups; and
   redistributing the retrieved encoded blocks amongst at least two further storage groups of the plurality of storage groups.

15. A method of storing a data set in a storage system, wherein the storage system comprises a plurality of storage groups representing different storage media, wherein the method comprises:
   forming at least one data set block from the data set using a fragmentation entity;
   encoding the at least one data set block by means of an encoding entity, wherein the encoding entity provides a plurality of encoded blocks based on the at least one data set block at an output of the encoding entity and uses a rateless erasure encoding algorithm based on rateless codes for encoding the at least one data set block;
   distributing the encoded blocks amongst at least two of the plurality of storage groups using a distribution entity for storage thereof by the storage groups, wherein the encoded blocks are distributed amongst a number of g storage groups, and wherein $n_{crit}$ is the number of encoding blocks required for decoding the data set with a sufficiently large probability of success, wherein each of the g storage groups receives at least $n_g$ encoded blocks, with $$n_g = \frac{n_{crit}}{(g-s)} \text{ and } n_g, n_{crit}, g, s \in \mathbb{N} \wedge g > 0$$

wherein s is the maximum number of storage groups that are allowed or expected to concurrently fail, g>s, and s≥2;
   wherein each of the g storage groups receives at least $n_g$ encoded blocks, with $$n_g = \frac{n_{crit}}{(g-s)} \text{ and } n_g, n_{crit}, g, s \in \mathbb{N} \wedge g > 0$$

and r is the minimum fraction of non-defective encoded blocks in each storage group;
   after storage of the encoded blocks on the at least two storage groups, retrieving one or more encoded blocks from at least one of the at least two storage groups; and
   redistributing the retrieved encoded blocks amongst at least two further storage groups of the plurality of storage groups.

16. The method of claim 1, wherein at least two of the storage groups are directly connected to a single local system.

17. The method of claim 1, wherein at least two of the storage groups reside at different geographical locations from each other and are interconnected through a telecommunications network.

18. The method of claim 1, wherein the storage groups representing different storage media are directly connected to a local system or are interconnected through a telecommunications network.

19. The storage system of claim 9, wherein at least two of the storage groups are directly connected to a single local system.

20. The storage system of claim 9, wherein at least two of the storage groups reside at different geographical locations from each other and are interconnected through a telecommunications network.

21. The storage system of claim 9, wherein the storage groups representing different storage media are directly connected to a local system or are interconnected through a telecommunications network.

* * * * *